Oct. 17, 1961 R. S. YODER 3,005,049

ELECTRONIC CHASSIS AND IMPROVED BASE THEREFOR

Original Filed Sept. 3, 1957 3 Sheets-Sheet 1

INVENTOR.
Raymond S. Yoder
BY Mueller & Aichele
Attys.

Oct. 17, 1961 R. S. YODER 3,005,049

ELECTRONIC CHASSIS AND IMPROVED BASE THEREFOR

Original Filed Sept. 3, 1957 3 Sheets-Sheet 2

INVENTOR.

Raymond S. Yoder

BY Mueller & Aichele

Attys

Oct. 17, 1961 R. S. YODER 3,005,049

ELECTRONIC CHASSIS AND IMPROVED BASE THEREFOR

Original Filed Sept. 3, 1957 3 Sheets-Sheet 3

INVENTOR.

Raymond S. Yoder

BY Mueller & Aichele

Attys

United States Patent Office 3,005,049

Patented Oct. 17, 1961

3,005,049

ELECTRONIC CHASSIS AND IMPROVED BASE THEREFOR

Raymond S. Yoder, Oak Park, Ill., assignor to Motorola, Inc., Chicago, Ill., a corporation of Illinois Continuation of application Ser. No. 681,591, Sept. 3, 1957. This application Sept. 16, 1959, Ser. No. 840,474

15 Claims. (Cl. 178—7.9)

This invention relates to electronic chassis, and more particularly to chassis for television receivers having plated or printed circuit assemblies in contrast to circuits completed by conventional wiring, which are employed on a novel base or mounting member by means of novel fasteners, to make up in turn a complete electronic chassis of novel structure and assembly.

This application is a continuation of my copending application Serial No. 681,591, filed September 3, 1957, which has become abandoned and that application is a continuation-in-part of application Serial No. 520,836, filed July 8, 1955, which also has become abandoned.

Tremendous advances have been made in recent years in the printed and plated circuit art as applied to electronic equipment such as radio receivers and the like. It has been found that the use of printed and plated circuit techniques greatly simplifies the construction of such equipment and enables it to be manufactured more efficiently and at a lower cost. In the ensuing description and appended claims, the term "printed circuit" includes conductive or circuit patterns on insulating material whether the circuits are put on by a printing process, by plating, or by some generally corresponding method.

It has long been the goal in the electronics industry to use printed circuits in television receivers. However, the complexity of the circuitry involved in a television receiver and the size of the chassis utilized therein has discouraged attempts to proceed in this direction. In addition to size and complexity, however, other problems arise in the use of printed circuits in television receivers. For example, in order to gain full benefit from their use, the circuit panels should be so mounted that components and conductors can be carried on both sides thereof. In addition, it is important for the printed circuit panel to be rigidly supported in the receiver for mechanical and electrical stability but, at the same time, be readily detachable for repair or replacement. The heavy power requirements of a television receiver poses problems of insulation, and ruggedness in the chassis. Furthermore, the viewing or picture tube for a television receiver is of a size, and weight, and is fragile to the degree that there are problems in mounting the tube on or in connection with an electronic chassis not encountered in most other electronic equipments.

It is an object of the present invention to provide an improved television receiver which incorporates printed circuit panel assemblies, which may be constructed in an efficient and streamlined manner, and which readily lends itself to automatic fabricating processes.

It is another object of the invention to provide a strong, light-weight base frame for an electronic chassis, which includes means for securely yet detachably holding printed circuit panels thereon.

It is another object of the invention to provide a television chassis which can be easily secured to the cabinet of a television receiver while at the same time being electrically insulated from the cabinet.

It is yet another object of the invention to provide a pan-like base for inclusion in an electronic chassis to which base printed circuit assemblies carrying electronic components can be secured with the base providing adequate clearance for components and conductors secured to the side of the printed circuit panel facing the base so that both sides of the circuit can be fully utilized and desirable space economies effected.

A still further object of the invention is to provide such an improved printed circuit television receiver which is particularly designed to facilitate servicing and part replacement.

A feature of the invention is the provision of an improved television receiver which incorporates printed circuit assemblies, and which assemblies take the form of a plurality of such circuit panels rigidly yet detachably supported within the receiver on a frame or dished, pan-like chassis base, the base being secured to one of the sides of the receiver and also serving as a shielding means and a ground connection for the various printed circuit panel assemblies.

Another feature of the present invention is the provision of a dished chassis base pan having a number of depressed portions on its surface with the depressed portions surrounded by ledge portions and a number of intermediate portions which are recessed from the ledge portion but not to so great an extent as the depressed portions. These intermediate portions provide clearance for certain conductors and components on the underside of printed circuit panels affixed to the base and supported on its ledge portions.

Another feature of the invention is the provision of a plurality of lugs blanked out of the aforesaid ledge portions of the base which lugs are adapted to be bent over the edges of a printed circuit panel resting on the ledges and to secure the panel to the base in such a way that it is firmly held but is easily removed for repair or replacement.

Another feature of the invention is a chassis for an electronic apparatus, such as a television set, wherein the pan-like chassis base is held on internally threaded spacers of insulating material. The chassis is mounted to one side of the cabinet of a television set by screws held in the spacers and the spacers serve to physically separate and electrically insulate the conductive chassis base from the television cabinet. This enables metal cabinets to be employed with safety even though the chassis base itself is conductive.

The invention provides a metallic frame or pan-like chassis base on which supports one or more separable printed circuit panel assemblies on rib-like ledges formed in its surface. Independent dished or depressed portions separated by the ledges provide clearance for components and conductors carried on the underside of the panel and also serve to strengthen the base so that it firmly supports the panel assemblies. The ledge portions supporting the panel edges are provided with blanked-out lugs each having a pair of tapered arms which are bent over the edge of a panel to secure it rigidly to the pan. The arms are tapered at the edges engaging the panel to provide a secure grip. When it is desired to remove the panel assembly for repair or replacement, the arms of the lugs can be bent back to release the gripped panel and subsequently bent back to their gripping position to hold a replaced or substituted panel assembly. There are embodiments of the invention in which a plurality of circuit panel assemblies are supported on a frame or base in uniplanar edge-to-edge relation in order to have a single panel small enough to be readily handled by machine processes, but then are assembled together to have a circuit large enough for the complete apparatus requirements. In these embodiments, the ledge portions of the base supporting edges of adjacent panels are also provided with lugs which, because they have two independently movable arms, are used to interconnect adjacent panels with one arm gripping each adjacent panel edge. The adjacent panels have a conductive layer around their edges and since the lugs are blanked out of the conductive base, electrical connection is made between adjacent panel assemblies. Additional connection between adjacent panels is provided by a flexible strip having a jaw member at one end with its other end soldered into an opening adjacent the edge of a panel. The strip is bent over and its jaw member fits over a stud extending from the surface of an adjacent panel. The flexibility of the strip facilitates its disengagement from the stud and subsequent re-engagement with a corresponding stud of a replacement panel.

The chassis frame or pan and its circuit panel assemblies supported thereon is secured to and spaced from one side, such as the bottom side, of a television receiver cabinet by means of screws held in internally threaded plastic spacers which are attached to the bottom of the base. The spacers are of an insulating material such as polyethylene so that the base is effectively insulated from the television cabinet.

Figure 1:
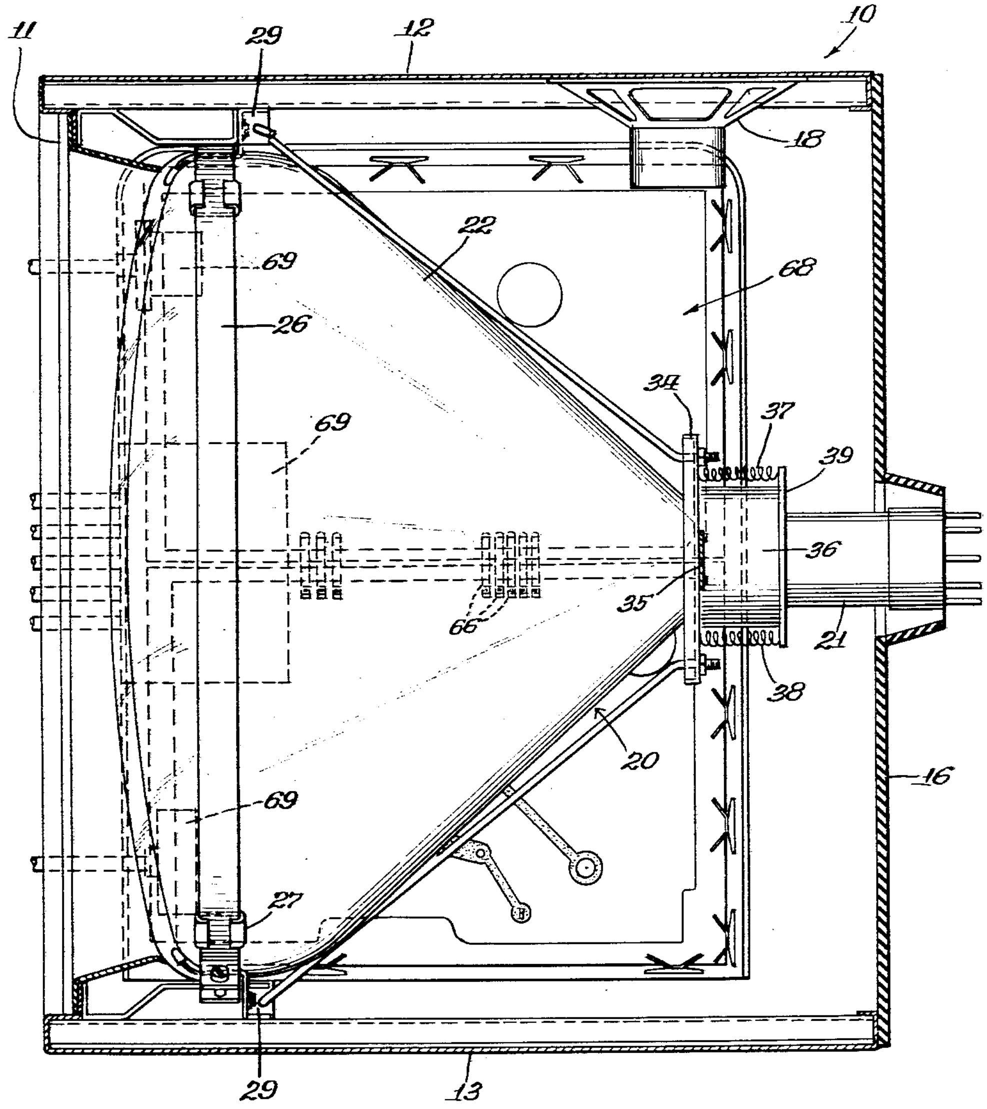
FIG. 1 is a top view of a television receiver constructed in accordance with the present invention with the top of the cabinet removed and looking down upon the picture tube and the electronic chassis.
Figures 5, 6, 8:
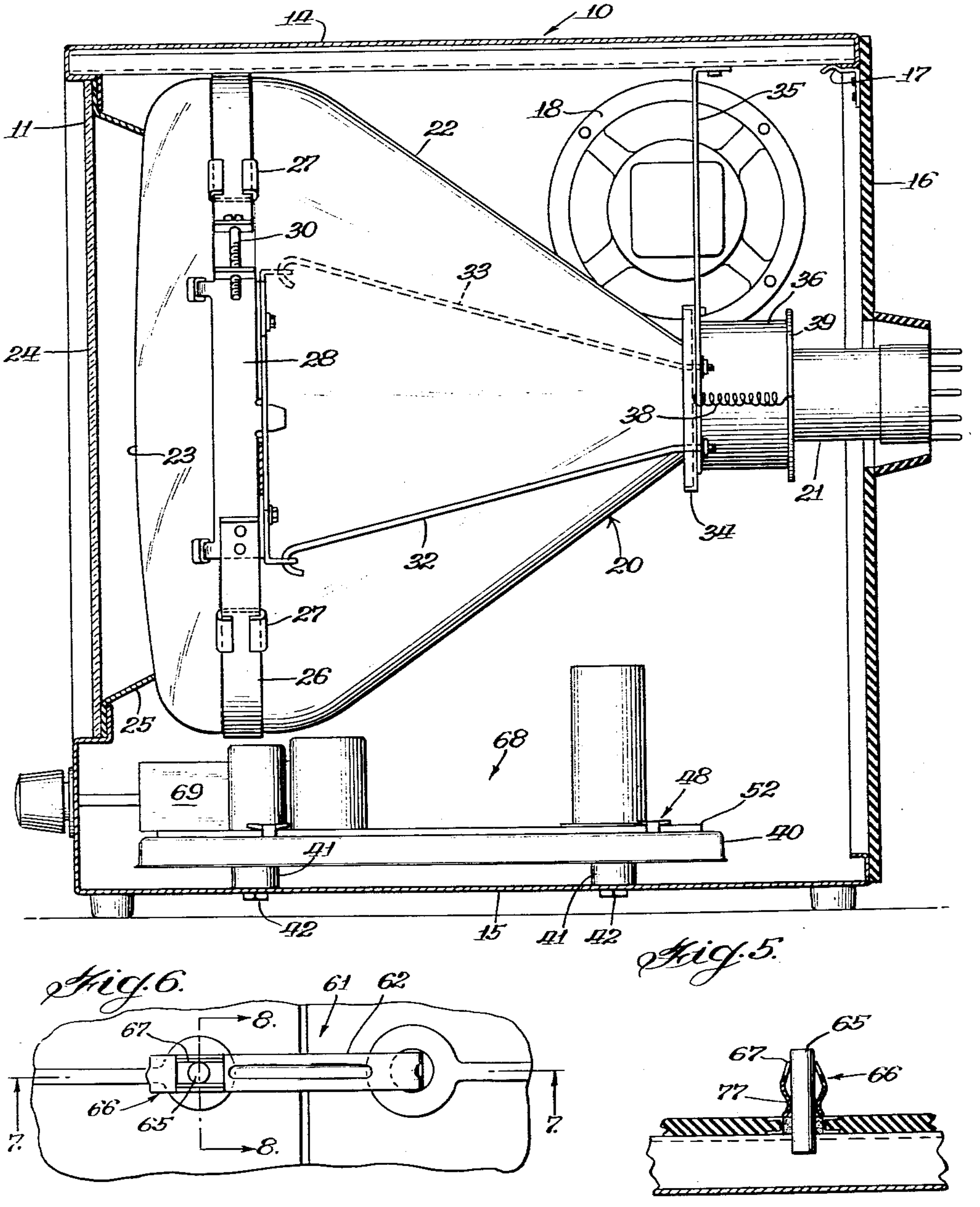
FIG. 5 is a side view of the television receiver illustrated in FIG. 1 with one side of the cabinet broken away.
FIG. 6 is an enlarged top view of a connector used to interconnect adjacent circuit panels in accordance with one embodiment of the invention.
FIG. 8 is a view in section taken on the line 8—8 of FIG. 6.

Referring now to the drawings and particularly to FIGS. 1 and 5, it may be seen that a television receiver embodying the invention includes a cabinet 10 having a front portion 11, and further having a plurality of sides 12, 13, 14 and 15 extending rearwardly from the front portion. The sides 14 and 15 constitute the top and bottom. The cabinet also includes a back portion 16 secured to the sides by usual snap fasteners such as the fastener 17 (FIG. 5). A speaker 18 is mounted on side 12 in known manner.

The receiver also includes a cathode-ray picture tube 20, having a neck portion 21 and an enlarged or bulbous portion 22. The picture tube also has a viewing screen 23 at the end of the bulbous portion which is disposed adjacent the transparent safety glass 24 of front portion 11 of the cabinet. The front portion also supports a bezel 25 which extends against the front of the picture tube and forms a frame for the screen 23.

The printed circuit panels of the chassis of the receiver are not suited for supporting the weight of the picture tube, and it is mounted on the cabinet in the manner described briefly below for the sake of completeness but which forms no part of the present invention and is merely exemplary of means of mounting the tube.

A flexible strap 26 is affixed to the bulbous portion of the picture tube and surrounds that portion adjacent screen 23. A plurality of resilient pads 27 are placed between strap 26 and the picture tube. The strap 26 is riveted to a pair of mounting brackets 28 (only one of which is shown in FIG. 5) on opposite sides of the picture tube 20, and the brackets have respective portions extending outwardly from the picture tube. This assembly is held together by a pair of set screws 30 which engage respective turned-up portions of the strap 26, and are threaded into respective turned-up portions of the brackets 28. The strap 26 and mounting brackets 28 are securely attached to the picture tube by tightening screws 30.

The mounting brackets 28 have respective turned-up portions 29, and a pair of side stays 32 and 33 extending rearwardly from these turned-up portions and are secured to a rigid plate 34 by a usual threaded nut arrangement. The rigid plate 34 is supported on the neck portion 21 of the picture tube 20 and bears against the bulbous portion 22 thereof. Plate 34 is secured to the side 13 of the receiver by a mounting bracket 35 which forms an additional support for the picture tube and which is usually only necessary during shipping of the receiver.

The deflection yoke 36 of the picture tube is supported on the neck section to the rear of the rigid plate 34, and the yoke is held on this section by a pair of resilient springs 37 and 38 which are affixed to plate 34 and which engage a further plate 39 to the rear of the deflection yoke.

A further pair of mounting brackets (not shown) are mounted on channel portions welded respectively to sides 12 and 14. These further mounting brackets are mounted adjacent the transparent front portion 10 of the cabinet in respective alignment with the mounting brackets 28 on strap 26 and are secured together through mating apertures so as to hold the image reproducer securely in the cabinet.

The electronic chassis generally indicated at 68 is secured to and insulated from the bottom side 15 of the cabinet through internally threaded spacer rings 41 held to a frame or pan-like base 40 by resilient pins **41*a* extending into suitable openings formed in the base. Screws 42 secure the spacers 41 to the cabinet. The spacers 41** are made of polyethylene or some other suitable insulating material and serve to electrically insulate the chassis from the cabinet.

Figures 2, 3:
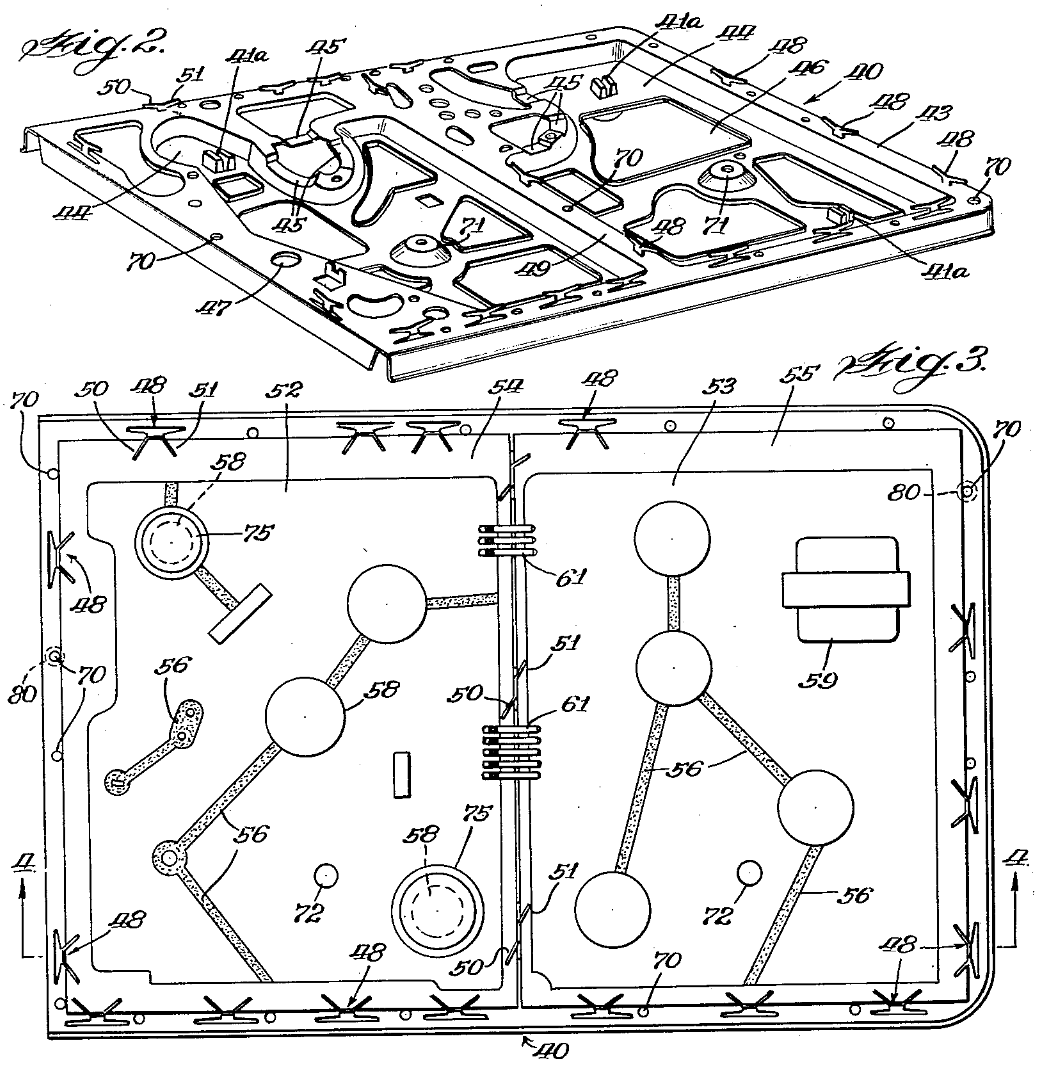
FIG. 2 is a perspective view of a pan-like chassis base in accordance with the invention.
FIG. 3 is a top view of a chassis base pan showing two printed circuit panels and attached components mounted on the pan.

The pan-like base 40 (as particularly shown in FIG. 2) is made of a conductive metal and has three different vertical levels, the ledge or raised portion 43, the depressed portions 44 and the intermediate portions 45. A number of openings 46 of various shapes are formed in the bottom or depressed portion of the base 40. The metal immediately adjacent these openings may be turned up to add to the strength of the base. The particular configuration of the openings 46 and of the ledge, depressed and intermediate portions shown in FIG. 2 are illustrative only and are determined by the particular requirements of the circuit to be carried on the base 40. The side and position of the openings 46 are determined, for example, by the size and number of components to be mounted on the underside of a circuit panel attached to the base and also by the size and position of heat generating components since the openings 46 provide for air circulation to prevent overheating of the components. The openings 46 also permit visual inspection of the bottomsides of circuit panels after they have been secured to the base 40. The openings 47 in the ledge portions are determined as to their size and position by the character of components such as tubes to be mounted on the top of the printed circuit panel.

The dished configuration of the base 40 provides it with enhanced strength for supporting relatively heavy components which could not be held by the relatively fragile circuit panels above. The position of some of the ledge portions 43 is usually such as to provide support for heavy components which could not be held by the unsupported circuit panel.

A number of lug members 48 are blanked out of the metal of the ledge portion of the base and are spaced around the periphery of the base and along the central ledge portion 49. Each of these lugs includes a pair of arms 50 and 51. As more particularly illustrated in FIGS. 1, 3 and 4, when printed circuit panels 52 and 53, are placed in uniplanar relation on the top surface of the horizontally positioned base 40 resting on the ledge portions thereof, they are secured to the base 40 by bending the arms 50 and 51 of the lugs 48 over the top of the panel to hold it between the arms 50 and 51 and the ledge portion 43. In order to provide a firm locking action of the arms 50 and 51 to the panels 52 and 53, the lower edges of the arms are tapered with respect to the flat surface of the panel and thus wedge the panel edge against the ledge portion of the base 40 to provide a particularly tight grip for firm mounting of the panels.

The panels are also held on the base 40 at the circular raised portions or bosses 71 formed in the surface of depressed portion 44 by means of set screws 72 passing through apertures in the bosses 71 and in the panels. These provide central ground connections so that the base 40 serves to shield the circuits and components on the undersides of the various panels from one another.

In the embodiment of the invention illustrated where a pair of printed circuit panels such as 52 and 53 are mounted side by side on the base 40 a row of lugs 48 is also blanked out of the central ledge portion 49. As shown in FIGS. 1 and 3, these lugs are used to hold the panels 52 and 53 together at their edges by turning the arm 50 over the edge of the one panel 52 while turning the other arm 51 over the edge of the panel 53. Although two circuit panels are mounted on the base 40 in the embodiment of the invention particularly illustrated, it will be understood that the configuration of the base can be adapted to mount greater numbers of panels mounted edge-to-edge in uniplanar relation, or that only a single panel may be employed.

Each of the printed circuit panels 52 and 53 is provided with peripheral conductive borders 54 and 55 respectively to which electrical contact is made by the arms 50 and 51 thus making additional ground connection to base 40 and electrically connecting the panels 52 and 53 to one another through the conductive lugs 48. However, panels without such conductive borders may also be employed and ground connections to the base 40 made solely by set screws 72 or other means and electrical connection between adjacent panels otherwise provided.

The horizontally positioned circuit panels 52 and 53 each carry conductive patterns indicated generally and in simplified form at 56 on their topsides and conductive patterns indicated generally at 57 (see FIG. 4) on their bottomsides. The bottom conductors 57 will often be in a position adjacent relatively large components such as an electron discharge device 58 or a transformer 59 mounted on the top face of the panels. In the embodiment of the invention illustrated, the conductive patterns on both surfaces are raised somewhat from the panel. In order to provide adequate clearance for the conductor of the pattern 57, the intermediate portions 45 in the base 40 are generally provided adjacent such large components. These provide adequate clearance for the conductive pattern 57 on the bottom surface of the panels. Components such as the resistor 60 are mounted on the bottom surface of the panels, and the intermediate portions 45 provide sufficient clearance for the components although they are sometimes mounted above the depressed portions 44 which are more deeply recessed from the panel surface or above openings 46. It will be understood, of course, that panels carrying components on their topsides only may be used.

Figure 4:
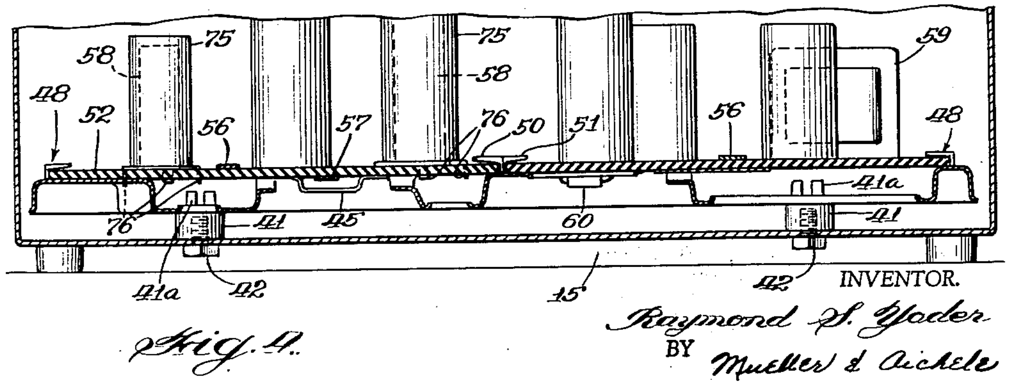
FIG. 4 is a view in section taken on the line 4—4 of FIG. 3 and showing the attachment of the chassis pan to a television receiver cabinet.

As shown in FIG. 4, some of the electron discharge devices 58 supported on the circuit panels are shielded. Appropriate shields are formed by the metal sleeve 75, which is slightly larger than the associated discharge device 58, and which has three integral solder lugs 76 formed at its lower edge and which extend into grounded plated apertures in the corresponding circuit panels to be soldered therein. In this manner the shield is bonded to the panel to be securely supported thereon and the shield is suitably grounded to the base 40.

Figure 7:
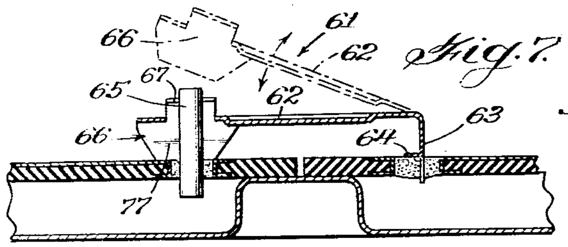
FIG. 7 is a view in section taken on the line 7—7 of FIG. 6.

In accordance with one embodiment of the invention, a plurality of solderless connectors 61 are provided for additional mechanical and electrical interconnection between adjacent panels. The connectors are designed to be readily disconnected so as to facilitate the removal of individual panels. These connectors are shown particularly in FIGS. 6–8 and each comprises a flexible metallic strip 62. One end 63 of the strip is curled over and is inserted into a plated aperture in one of the panels and soldered therein in electrical connection with the circuit of such panel. The end 63 is provided with a tab 64 to facilitate uniform depth of insertion of successive connectors into panel apertures. The free end of the flexible strip 62 spans over the next adjacent panel. The adjacent panel has an upright rigid stud 65 which is inserted into a plated aperture therein and which is soldered in that aperture in electrical contact with the circuit on the adjacent panel. The jaw 66 is formed in the free end of strip 62, and this jaw engages the stud extending through an aperture in the free end of the strip and making electrical contact with the retaining jaw. As shown in FIG. 8, the jaw 66 has a double locking effect provided by sharp integral edges 67 and rounded internal edges 77. These connectors form a convenient means for establishing a positive and secure contact between the various panels without the need for precise alignment of the strips and studs. Moreover, the flexible strips can easily be bent back from the studs whenever it is desired to remove any of the panels.

Since the metal constituting the lugs 48 is relatively thin and flexible, the panels 52 and 53 may easily be detached from the base by bending back the arms 50 and 51 of each lug 48 and by opening the connectors 61, if they be employed. The panel can then easily be removed for repair or for eventual replacement and reconnected simply by folding back the arms 50 and 51 of the lugs 48 and reconnecting the connectors 61. The peripheral ledge portion of the base as well as the central ledge portion are also provided with a number of holes such as 70 so that the panels may be secured to the base by the flanges of bolts passing through the holes if, after a number of replacements have been made, the arms of the lugs 48 should break loose due to metal fatigue. One such bolt 80 is indicated in phantom on FIG. 3 to show the position these bolts occupy when employed. Suitable drive screws or tapped machine screws may be used in place of bolts in some instances.

The electronic chassis, generally indicated at 68 in FIGS. 1 and 5, and which includes the dished, pan-like base and the circuit panels with the components carried thereon, is connected to the various manual potentiometer controls 69. These controls are supported on one of the circuit panels by a plurality of lugs (not shown) which are soldered into plated apertures in the panel and make electrical connection with the various parts of the circuits carried on them.

In the embodiment of the invention illustrated in FIGS. 1 and 5, the chassis 68 does not extend completely to the back of the cabinet. It is desirable to make the chassis base 40 a small, uniform size that it can be employed in several different model receivers. In some models, where a relatively long image reproducer is used, a cabinet substantially deeper than the chassis is employed as illustrated in FIGS. 1 and 5.

The invention provides, therefore, a commercially practical television receiver utilizing printed circuit assemblies. In addition, the invention provides an improved base or frame to which a printed circuit panel may be reliably and easily secured. The base member is provided with ledge portions for supporting the flat printed circuit panels and has depressed portions permitting components to be mounted on the underside of the circuit panel as well as intermediate portions permitting clearance of conductive patterns carried on the bottomside of the panel. In accordance with one embodiment of the invention, flexible metal lugs are used to provide reliable means for holding the panels in place and are so constructed as to permit easy removal of the panels for repair or replacement. The dished base is relatively light and at the same time provides adequate mechanical support for the printed circuit panels and the components carried thereon. It also permits circulation of air around the components which are likely to become heated during operation in order to prevent their overheating.

Although the specific embodiment of the invention described has been the application of the invention to television receivers, it will be understood that the pan-like base and the chassis may also be employed in other types of electronic equipment employing printed circuits.

I claim:

1. An electronic apparatus chassis including in combination an essentially flat printed circuit panel with electrical circuit and component means thereon, said chassis including a metal frame-like base having ledge portions about the periphery of and depressed portions inwardly of the ledge portions and depressed sufficiently relative to said ledge portions to be out of contact with a printed circuit panel on the base, boss portions within the periphery of said base and of a height relative to the depressed portions so that said printed circuit panel is supported on said ledge portions and said boss portions, with said ledge portions adapted to have the edge of said printed circuit panel releasably secured thereto and means releasably securing the periphery of said printed circuit panel to said ledge portions and to said boss portions for firm support of said printed circuit panel and said electrical circuit and component means.

2. A chassis for electronic apparatus employing thereon a printed circuit panel, said chassis including in combination, a printed circuit panel supporting base including a ledge portion defining a panel reinforcing frame, a depressed portion inwardly of said ledge portion and spaced away from a corresponding side of a printed circuit panel on said base, a boss portion on said depressed portion and within said panel reinforcing frame, a printed circuit panel supported on said ledge portion and on said boss portion said printed circuit panel having a plurality of electrical circuit components supported thereon and a plurality of releasable fastening means securing said printed circuit panel to said supporting base at said ledge portion and said boss portion to provide reinforcement of said printed circuit panel.

3. A chassis for electronic apparatus employing thereon a printed circuit panel, said chassis including in combination, a printed circuit panel supporting base including spaced ledge portions defining a panel reinforcing frame and a depressed portion with an opening therein intermediate said ledge portions and spaced away from a corresponding side of a printed circuit panel on said base, a plurality of boss portions on said depressed portion, a printed circuit panel having electrical conductors on each side and circuit components supported thereby, said printed circuit panel being supported on said ledge portions and said boss portions so that said depressed portion is spaced from said electrical conductors of said panel and said opening provides air circulation to said panel, and a plurality of releasable fastening means securing said printed circuit panel to said base at said ledge portions and said boss portion to provide firm support of said panel and said circuit components.

4. A television receiver including in combination, a cabinet having a transparent front portion and a plurality of sides extending rearwardly therefrom, a metallic frame removably secured to one of said sides of said cabinet and shaped to have a plurality of supporting ledge portions both around the peripheral edge of said frame and centrally thereof, relatively large size printed circuit panel means carrying a plurality of receiver stages and disposed on said ledge portions, a plurality of removable holding means securing all edges of said printed circuit panel means to said ledge portions for reinforcing said panel means with said receiver stages thereon, and a bank of plug-type electrical connectors only along one edge of said panel means for establishing electrical contact to said panel means.

5. A television receiver including in combination, a cabinet having a transparent front portion forming a viewing screen and a plurality of sides extending rearwardly therefrom; panel supporting frame means secured to one of said sides of said cabinet and having depressed portions separated by raised supporting portions; printed circuit panel means carrying a plurality of television receiver stages and spanning said depressed portions of said frame means and removably secured to said supporting portions; said supporting portions extending around the entire periphery of said panel means for reinforcement thereof, and a plurality of electric connectors for establishing electrical contact to said panel means; said connectors comprising a plurality of non-yielding conductors disposed along one edge of said panel means and a corresponding bank of flexible contactors forming jaw members supported in fixed relation to removably engage said non-yielding conductors.

6. A television receiver including in combination, a cathode-ray image reproducer having a bulbous portion with a viewing screen disposed at one end thereof, a cabinet having a transparent front portion and a plurality of sides extending rearwardly therefrom, said cabinet having means to clamp and support said image reproducer with its viewing screen disposed adjacent said front portion thereof, a panel supporting frame disposed in said cabinet and having open portions therein separated by raised support portions, printed circuit panel means spanning said open portions of said frame and removably secured to said support portions, television components for a plurality of receiver stages supported on the side of said panel means opposite said frame, said panel means being of a size to carry all of such components in spaced relation and said support portions engaging substantially the entire periphery of said panel means so the same is rendered mechanically secure by affixation thereof to said frame, and a bank of plug and socket type connectors for establishing all of the electrical contacts to said panel means and said components.

7. A television receiver including in combination, a cabinet, a panel supporting base of conductive metal, a plurality of insulating spacers secured to said base, means for securing said spacers to one side of said cabinet to secure said base thereto, said spacers electrically insulating said base from said cabinet, said base having a plurality of depressed portions therein with ledge portions around the same, printed circuit panel means having conductive patterns formed on both sides thereof and supported on said ledge portions of said base, a plurality of removable fasteners engaging said panel means at all of the edges thereof to secure the same to said ledge portions, and a plurality of television receiver components secured to one side of said panel means.

8. A television receiver including in combination, a cathode-ray image reproducer with a viewing screen disposed at one end thereof, a cabinet having a transparent front portion and a plurality of sides extending rearwardly therefrom, said cabinet being adapted to receive the image reproducer and including means to mount the same with its viewing screen disposed adjacent said front portion thereof, panel supporting frame secured to one of said sides of said cabinet and having a plurality of openings therethrough with ledge portions at the sides of said frame and raised portions intermediate said ledge portions, a printed circuit panel assembly with components for a plurality of television receiver stages carried thereby, releasable fastening means for affixing the edges of said panel assembly to said ledge portions and to said raised portions, and solderless connectors providing the sole external electrical connection to said panel assembly, including a bank of such connectors disposed along one edge of said panel assembly, whereby said panel assembly is reinforced around the entire periphery and intermediate such periphery for support of said components thereby.

9. A chassis for electronic apparatus, said chassis including in combination, a pan-like base having a plurality of depressed portions therein with each depressed portion having a ledge portion around the same, supporting portions intermediate the periphery of said base, an assembly positioned over each depressed portion and supported on an adjacent ledge portion and on a supporting portion with each assembly including a flat insulating panel having a pattern of conductors on both surfaces thereof serving as the electrical conductor means for said assembly, and said assembly further including electronic components mounted on said panel, said pan-like base having portions adjacent some of said components which are depressed to be intermediate the ledge portions and the depressed portions, a plurality of lugs blanked out of said ledge portions and bent over the edges of said panel and securing it to said base, and a plurality of non-conductive spacers attached to said base for supporting the same.

10. A chassis for electronic apparatus, said chassis including in combination, a pan-like base having a plurality of depressed portions therein with each depressed portion having a ledge portion around the same, supporting portions intermediate the periphery of said base, a plurality of printed circuit panels in edge-to-edge uniplanar relation positioned over each depressed portion and supported on an adjacent ledge portion and on said supporting portions, means for electrically connecting adjacent circuit panels and securing them together and means for securing the edges of said circuit panels to said ledge portion of said base.

11. An electronic apparatus chassis including in combination, a panel supporting base having a plurality of depressed portions therein with each depressed portion having a ledge portion around the same, a plurality of flat printed circuit panels each having a topside and a bottomside supported with the bottomsides resting on said ledge portions and spanning said depressed portions, said depressed portion providing clearance for electronic components and conductive patterns carried on the bottomsides of said circuit panels, a plurality of lugs blanked out of said ledge portions and securing the edges of said circuit panel to said base, and a plurality of connectors adapted to hold adjacent circuit panels in edge-to-edge uniplanar relation with each of said connectors including a flexible metal strap having one end soldered into an aperture adjacent an edge of a panel and having a jaw member at the other end adapted to engage an upright stud carried on said adjacent panel with said jaw member of said connector provided with a pair of sharp integral edges and a pair of rounded internal edges to facilitate locking said connector to said stud.

12. A television receiver including in combination, a cabinet, a pan-like base of conductive metal, a plurality of insulating spacer rings secured to said base, means for securing said spacer rings to the bottomside of said cabinet to secure said base thereto, said spacer rings electrically insulating said base from said cabinet, said base having a plurality of depressed portions therein each with a ledge portion around the same, supporting portions intermediate the periphery of said base, a plurality of intermediate portions recessed from said ledge portion to a lesser extent than said depressed portions and a plurality of openings formed in said depressed portions, a plurality of flat printed circuit panels each having conductive patterns formed on both the topsides and bottomsides thereof supported on said base with their bottomsides resting on said ledge portions and on said supporting portions, a plurality of lugs, each including a pair of tapered arms blanked out of said ledge portions adjacent the edges of said panels and having said arms bent over said edges of said panels to secure them to said ledge portions and a plurality of flexible connectors adapted to hold adjacent circuit panels in edge-to-edge uniplanar relation.

13. A television receiver including in combination, a cabinet having a transparent front portion and a plurality of sides extending rearwardly therefrom, a pan-like member removably secured to and insulated from one of said sides of said cabinet and having dished portions separated by ledge portions, a plurality of printed circuit panel assemblies spanning said dished portions of said pan-like member in uniplanar relation and removably secured to said ledge portions, a bank of electric connectors along the edges of said panel assemblies for establishing electrical contact between respective ones of said panel assemblies, and a plurality of control units including lug portions extending through apertures in a panel included in such panel assemblies.

14. Electronic apparatus including in combination, panel supporting frame means having openings therein and spaced supporting ledges with intermediate raised portions; a housing cabinet and insulating means for mounting said frame means therein; apertured printed circuit panel means spanning said openings of said frame means and disposed upon said raised portions and said supporting ledges; a plurality of electrical circuit components mounted on said panel means; a plurality of electric connectors for establishing electrical contact to said panel means, said connectors comprising a plurality of non-yielding conductors aligned along one edge of said panel means and a corresponding bank of aligned, flexible contactors forming jaw members supported to removably engage said non-yielding conductors; and means for clamping said panel means to said frame means including said ledges and said raised portions and including manually operable means for releasing said panel means from said frame means.

15. A television receiver including in combination, a cathode ray image reproducer with a viewing screen disposed at one end thereof, a cabinet having a front bezel and a plurality of sides extending rearwardly therefrom and a back enclosing said sides, said cabinet being adapted to receive the image reproducer and including means to mount the same with the viewing screen thereof visible within said bezel, a panel supporting frame removably secured to, and electrically insulated from, one of said sides of said cabinet, said frame having a plurality of openings therethrough with ledge portions at the sides of said frame and raised portions intermediate said ledge portions, a printed circuit panel assembly with components for a plurality of television receiver stages carried thereby, means for clamping said panel assembly to said ledge portions and said raised portions for reinforcing the same to firmly support said components and including manually operable means for releasing said panel assembly from said frame, a plurality of rigid electrical contacts along one edge of said panel assembly and a bank of corresponding resilient connectors adapted to be electrically connected to said contacts of said panel assembly whereby said panel assembly is removable by release of said fastening means and disengagement of said electrical connectors.

References Cited in the file of this patent

UNITED STATES PATENTS

| | | |
|---|---|---|
| 2,508,030 | Karns | May 16, 1950 |
| 2,570,017 | Wedig | Oct. 2, 1951 |
| 2,581,967 | Mitchell | Jan. 8, 1952 |
| 2,592,552 | Florez et al. | Apr. 15, 1952 |